(12) United States Patent
Fukumoto

(10) Patent No.: US 6,307,264 B1
(45) Date of Patent: *Oct. 23, 2001

(54) SEMICONDUCTOR DEVICE, ACTIVE MATRIX SUBSTRATE AND PROCESS FOR PRODUCTION THEREOF

(75) Inventor: Yoshihiko Fukumoto, Atsugi (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/714,437

(22) Filed: Sep. 16, 1996

(30) Foreign Application Priority Data

Sep. 14, 1995 (JP) .................................................. 7-236865
Sep. 12, 1996 (JP) .................................................. 8-241939

(51) Int. Cl.$^7$ .................................................. H01L 23/52
(52) U.S. Cl. .................... 257/750; 257/249; 257/291; 257/292; 257/293; 257/462; 257/752; 257/758; 257/760; 257/765; 257/771; 257/775
(58) Field of Search .................. 257/750, 752, 257/758, 760, 765, 771, 775, 249, 291–293, 462, 59, 72

(56) References Cited

U.S. PATENT DOCUMENTS

| 5,426,523 | * | 6/1995 | Shimada et al. | 359/54 |
| 5,596,230 | * | 1/1997 | Hong | 257/758 |
| 5,602,423 | * | 2/1997 | Jain | 257/752 |

FOREIGN PATENT DOCUMENTS

| 0363100 | 4/1990 | (EP) . |
| 0710981 | 5/1996 | (EP) . |
| 0751417 | 1/1997 | (EP) . |
| 5-28925 | 1/1990 | (JP) . |
| 5-251412 | 9/1993 | (JP) . |
| WO 27321 | 11/1994 | (WO) . |

OTHER PUBLICATIONS

IBM Tech. Discl. Bull., vol. 33, No. 4 (Sep. 1, 1990) pp. 223–24.

* cited by examiner

*Primary Examiner*—Eddie Lee
*Assistant Examiner*—Matthew E. Warren
(74) *Attorney, Agent, or Firm*—Fitzpatrick, Cella, Harper & Scinto

(57) ABSTRACT

A process for producing a semiconductor device comprises a step of polishing of a region of an electroconductive material serving as an electrode or a wiring line in an insulating layer formed on a semiconductor region, the region of the electroconductive material being electrically connected to the semiconductor region, wherein a region of another material is formed within the region of the electroconductive material to be polished. Also a semiconductor device having the region is provided. A process for producing an active matrix substrate comprises a step of polishing of picture element electrodes made of a metal provided on crossing portions of plural signal lines and plural scanning lines and a means for applying voltage to the picture elements, wherein a region of another material is formed within the region of the picture element electrode to be polished. An active matrix substrate has such picture element electrodes as mentioned above.

20 Claims, 12 Drawing Sheets

SEMICONDUCTOR DEVICE, ACTIVE MATRIX SUBSTRATE AND PROCESS FOR PRODUCTION THEREOF

BACKGROUND OF THE INVENTION

1. Field of the Invention

The present invention relates to a semiconductor device and an active matrix substrate which is improved in the electrode or wiring thereof. The present invention also relates to a process for producing the semiconductor device or the active matrix substrate.

2. Related Background Art

Semiconductor devices usually have wiring for connecting the semiconductor substrate or the semiconductor layer with an external circuit. The wiring is generally made by Al (aluminum). An example of the process for Al wiring or Al electrode formation is Damascene Process employing CMP (chemical mechanical polishing) reported in '94 VLSI Symp. This process is explained below by reference to FIGS. 14A to 14D. In FIGS. 14A to 14D, a thermal oxidation film 61, and an insulating interlayer film 62 are formed on a silicon substrate 60 (FIG. 14A). The insulating interlayer film 62 is patterned to form an Al-embedding pattern 63 (FIG. 14B). Thereon, an Al film 64 is formed by sputtering (FIG. 14C) in a thickness larger than the height of the Al-embedding pattern. Then the Al film 64 is polished by a CMP method to form an Al electrode 65 (FIG. 14D).

In the wiring or electrode formation by the Damascene process described above, the Al electrode 65 is concaved and becomes thinner in the middle portion of disadvantageously as shown in FIG. 15E. This thinning is called dishing. This dishing is caused by non-uniform polishing owing to difference of CMP polishing rates between the material of the metal layer such as Al and the material of the insulating layer such as p-SiO coexisting in one and the same polishing plane, and deformability of the polishing cloth. The material of a higher polishing rate is polished more. The polishing rate of Al is four or five times as high as that of p-SiO, resulting in dishing of the Al electrode 65. The degree of dishing increases with increase of the size of the Al electrode as shown in FIG. 16, and at the size of 300 $\mu$m of the Al electrode the dishing can reach about 3000 Å. When the Al electrode is in a size of several hundred $\mu$m like the portion of a wire bonding pad, the Al electrode 65 can be partly removed by excessive dishing to render the wire bonding impracticable and to lower productivity of elements. Further, in Al wiring, the dishing increases the resistance of the wiring to deteriorate the properties of the devices.

SUMMARY OF THE INVENTION

The object of the present invention is to provide a process for producing a semiconductor device and an active matrix substrate with a reduced degree of dishing of the electrode or wiring.

The process for producing a semiconductor device of the present invention comprises a step of polishing of a region of an electroconductive material serving as an electrode or a wiring line in an insulating layer formed on a semiconductor region, the region of the electroconductive material being electrically connected to the semiconductor region, wherein a region of another material is formed within the region of the electroconductive material to be polished.

The process for producing an active matrix substrate of the present invention comprises a step of polishing picture element electrodes made of a metal provided on crossing portions of plural signal lines and plural scanning lines and a means for applying voltage to the picture elements, wherein a region of another material is formed within the region of the picture element electrode to be polished.

The above mentioned technical problems are solved and the above object can be achieved by the present invention having the constitution above.

The present invention relates also to a semiconductor device and an active matrix substrate.

The semiconductor device of the present invention has a region of an electroconductive material serving as an electrode or a wiring line in a insulating layer formed on a semiconductor region, the region of the electroconductive material being electrically connected to the semiconductor region, wherein a region of another material is formed within the regions of the electroconductive material.

The active matrix substrate of the present invention has picture element electrodes made of a metal provided on intersecting points of plural signal lines and plural scanning lines, and a means for applying voltage to the picture elements, wherein a region of another material is formed within the region of the picture element electrode.

The electroconductive material or the picture element electrode material of the present invention is preferably aluminum. The region of another material is preferably made from SiO or SiN.

The semiconductor device of the present invention includes ordinary ICs, and liquid crystal display device having a displaying section and a driving section in integration. The active matrix substrate of the present invention includes those used for liquid crystal display apparatuses, and those used for display devices in which the picture element electrode such as DMD (digital micromirror device) is moved.

The process of the present invention produces a semiconductor device or an active matrix substrate with a reduced degree of dishing of the electrode or wiring according to the present invention. Thereby, the variation of wiring resistance is sufficiently reduced, and the resulting semiconductor device has excellent properties. Further, the formed electrode is sufficiently flat, and the resulting active matrix substrate of the present invention is improved in brightness and contrast of the displayed image. The semiconductor device and the active matrix substrate of the present invention has sufficiently low wiring resistance and has electrodes in a nearly planar face, giving an image display with improved brightness.

DESCRIPTION OF THE PREFERRED EMBODIMENTS

The present invention is described by reference to FIGS. 1A to 4M. The steps of producing a semiconductor device of the present invention is explained successively. The drawings for the explanation show only a wire bonding pad portion. The other portions such as transistor portions and wiring portions are produced as in usual semiconductor process.

Figure 1A:
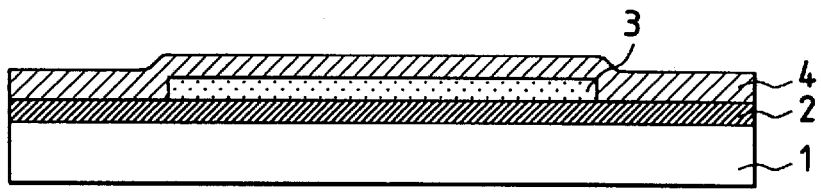
FIGS. 1A to 1D illustrate schematically an example of the process for producing a semiconductor device of the present invention.
Figure 1B:
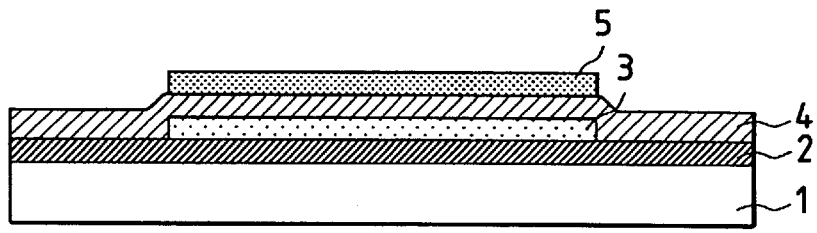
Figure 1C:
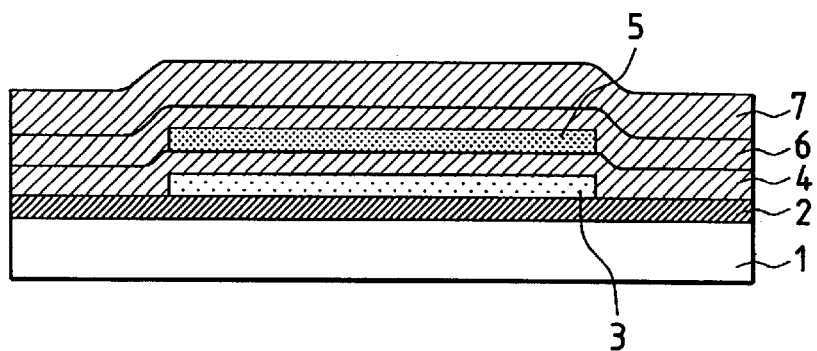
Figure 1D:
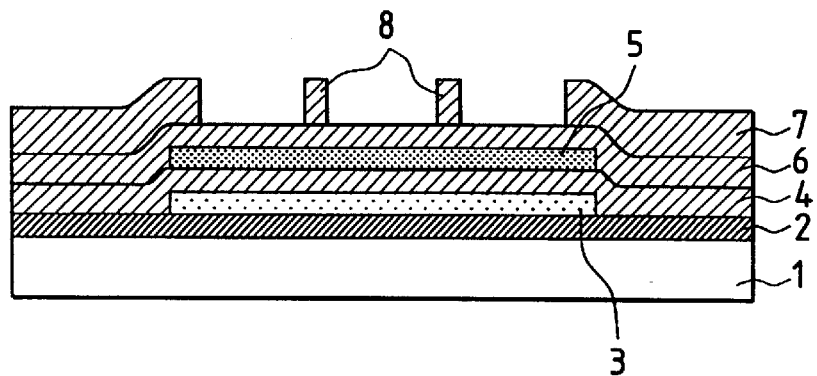
Figure 2E:
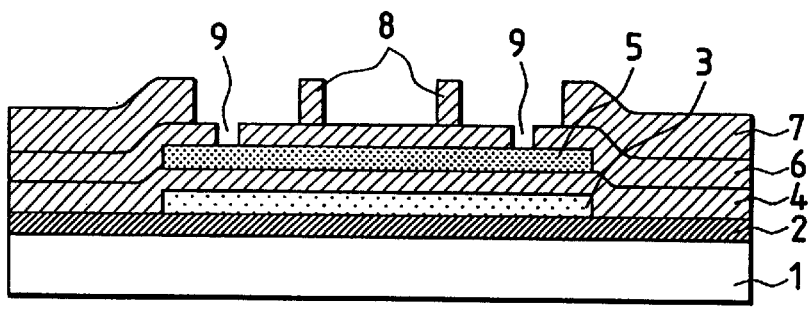
FIGS. 2E to 2H illustrate schematically another example of the process for producing a semiconductor device of the present invention.
Figure 2F:
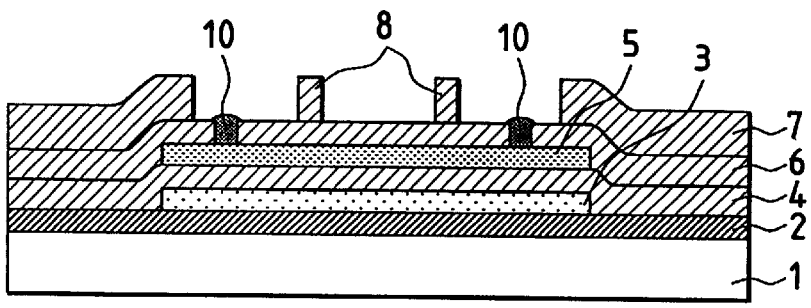
Figure 2G:
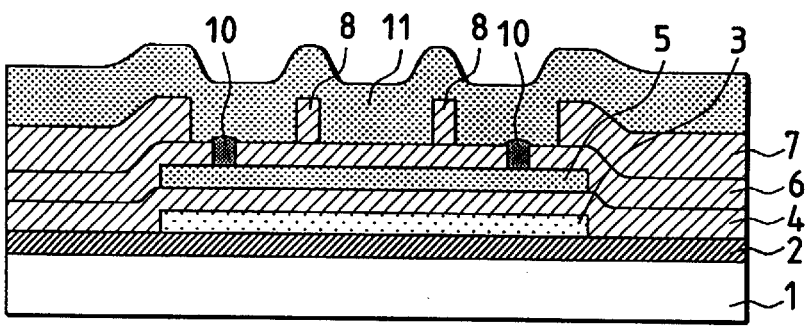
Figure 2H:
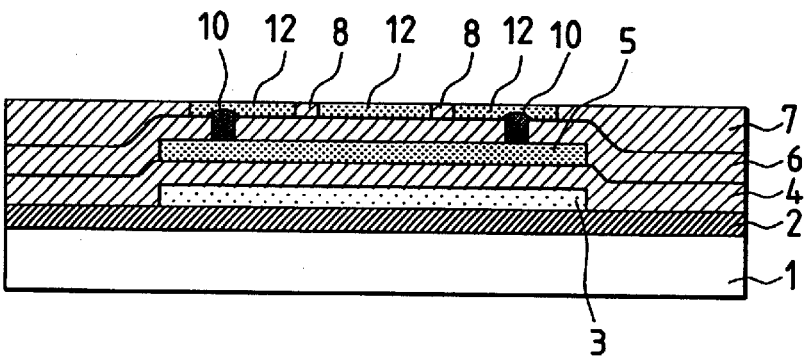

Firstly, a semiconductor substrate 1 is thermally oxidized to form a field oxidation film 2 of about 8000 Å thick. Then polysilicon 3 is formed in a thickness of about 4400 Å, simultaneously, for example, with formation of a gate electrode of a MOS transistor. Polysilicon 3 is provided to form the pad portion at the highest level on the wafer plane, prior to the later CMP step. Thereon, BPSG (Boro-Phospho-Silicate Glass) 4 is formed in a thickness of about 8000 Å (FIG. 1A). An Al (aluminum) wiring 5 is formed (FIG. 1B). A p-SiN film 6, and p-SiO film 7 are laminated (FIG. 1C). Then p-SiO film 7 is subjected to patterning to form polishing-stopping portions 8 (hereinafter referred to as a polish-stopper) in an island state within the pad portion (FIG. 1D). In dry etching or wet etching in the patterning, p-SiN 6 serves as an etching-stopper layer, since the etching selectivity of Plasma Silicon Oxide (e.g., silicon oxide formed by plasma CVD, "P-SiO") to Plasma Silicon Nitride (e.g., silicon nitride formed by plasma CVD, "P-SiN") is about 3 in dry etching and about 6 in wet etching with BHF (buffered hydrofluoric acid). Then through holes 9 are formed (FIG. 2E). A tungsten film is deposited selectively in the through hole 9 by CVD to form tungsten plugs 10 (FIG. 2F). In place of the tungsten in this example, another metal such as Al, and Ti may be used to fill the through holes 9. Thereon, an Al film 11 is formed (FIG. 2G) in a thickness larger than p-SiO 7. Then the surface of the wafer is polished by CMP (chemical mechanical polishing) to flatten the device surface and to insulate the pad portion from other electrodes (FIG. 2H). A practical CMP polishing is conducted, for example, by employing a CMP-224CMP apparatus (SPEED FAM K.K.), by use of Politex DG as the polishing cloth, Planerlite 5102 (Fujimi K.K.) as the slurry, under polishing conditions of a slurry flow rate of 100 mL/min, the platen speed/carrier speed of 40 rpm/39 rpm, and a wafer compression pressure of 200 g/cm$^2$. A similar results can be obtained by employing an apparatus EPO-114CMP (Ebara Corporation), by use of Supreme RN-H (D51) the polishing cloth, Planerlite 5102 (Fujimi K.K.) as the slurry, under polishing conditions of a slurry flow rate of 200 mL/min, the platen speed/carrier speed of 50 rpm/49 rpm, and a wafer compression pressure of 200 g/cm$^2$. The cleaning after the CMP polishing may be conducted by subsequent megasonic spin washing with cathode water having pH higher than 7 obtained by electrolysis of pure water and scrubbing with a PVA brush. A higher effect of particle removal can be obtained by conducting the megasonic spin washing by using cathode water of the water electrolysis containing 0.01 ppm of $NH_4OH$.

Figure 3I:
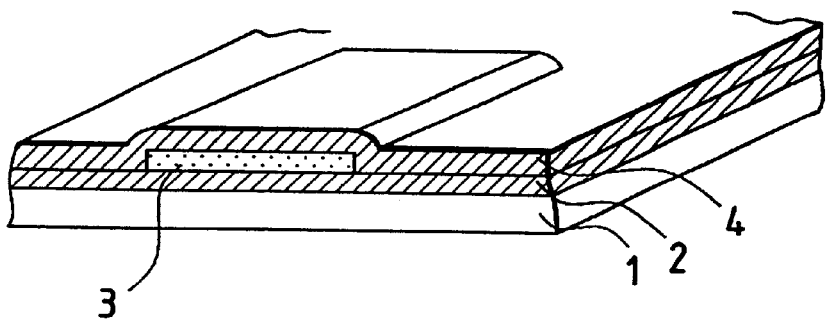
FIGS. 3I to 3K illustrate schematically still another example of the process for producing a semiconductor device of the present invention.
Figure 3J:
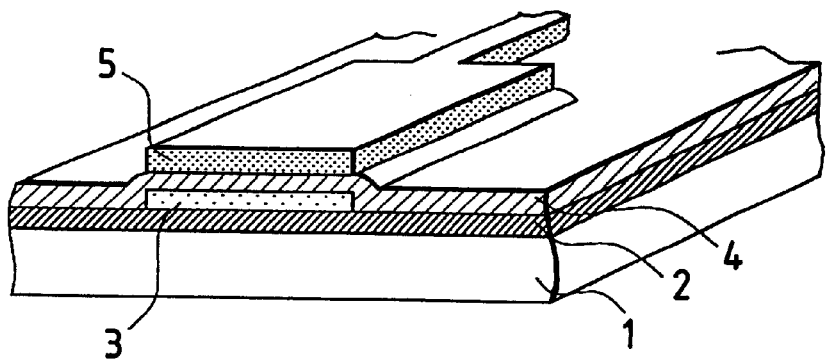
Figure 3K:
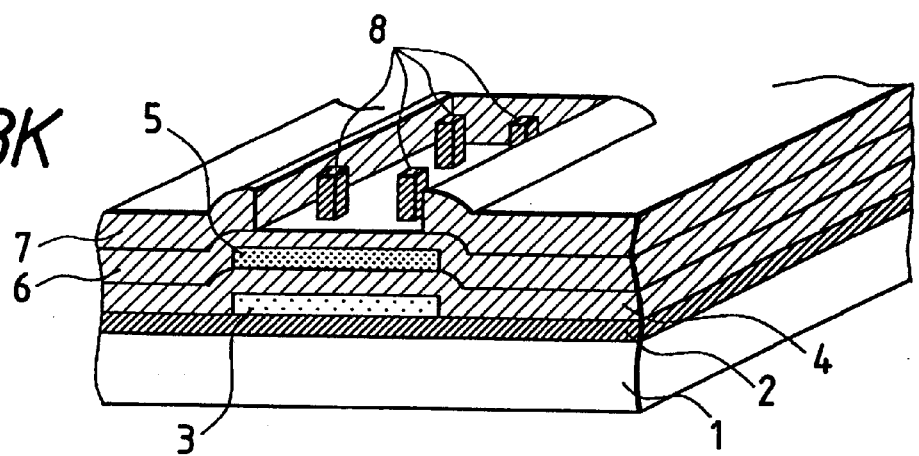
Figure 4L:
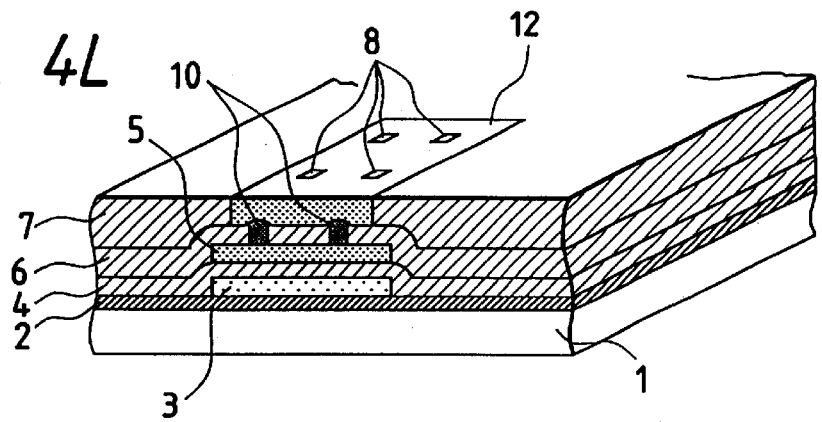
FIGS. 4L and 4M illustrate schematically a further example of the process for producing a semiconductor device of the present invention.
Figure 4M:
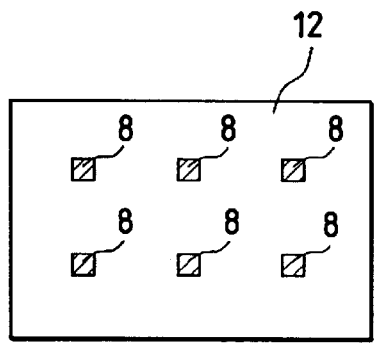

FIG. 3I is a perspective view of the state of FIG. 1A. FIG. 3J is a perspective view of the state of FIG. 1B. FIG. 3K is a perspective view of the state of FIG. 1D. FIG. 4L is a perspective view of the state of FIG. 2H. FIG. 4M is a plan view of the state of FIG. 2H or FIG. 4L. As shown in FIG. 3K, polish-stoppers 8 are formed in a shape of a column without partitioning electrically the Al electrode 12.

This embodiment is characterized by the polish-stoppers provided within the pattern of the pad electrode of Al electrode 12, whereby the dishing of Al electrode 12 caused in CMP polishing is reduced, and scraping of the Al electrode is prevented. Thereby, the yield in the metal CMP process is improved. Polish-stoppers 8 are in a square column shape in FIG. 4M, but may be in a shape of a regular pentagonal column, a regular hexagonal column, or other polygonal columns. The shortest distance from any point in Al electrode 12 to polish-stopper 8 or the side wall of Al electrode 12 is preferably not larger than 50 µm.

EXAMPLE 1

Figure 5A:
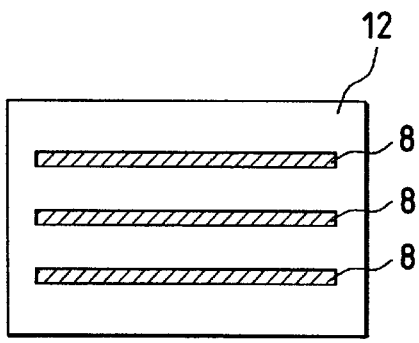
FIGS. 5A and 5B illustrate schematically a still further example of the process for producing a semiconductor device of the present invention.
Figure 5B:
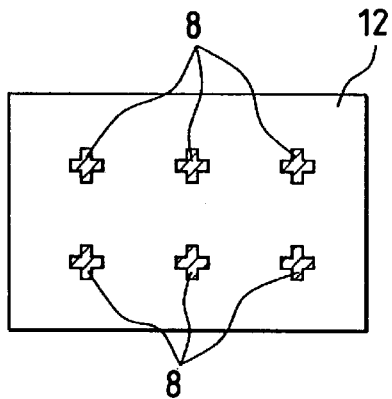
Figure 6C:
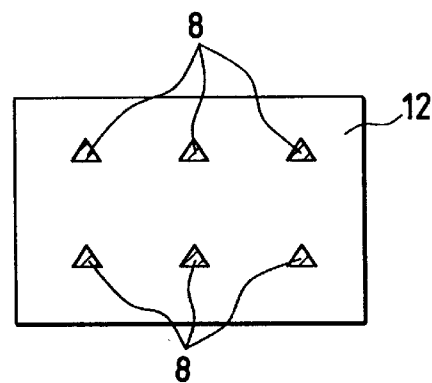
FIGS. 6C to 6E illustrate schematically a still further example of the process for producing a semiconductor device of the present invention.
Figure 6D:
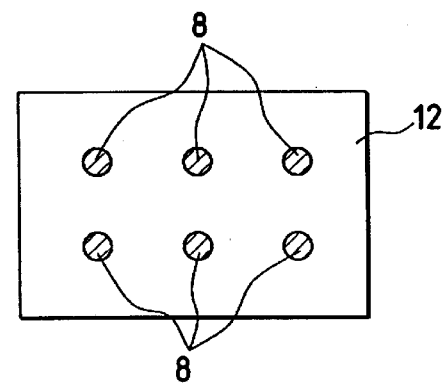
Figure 6E:
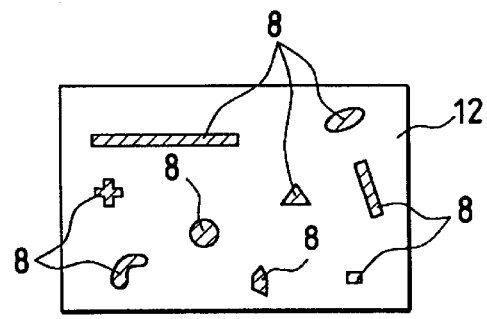

This Example is explained by reference to FIGS. 5A to 6E. FIGS. 5A to 6E are respectively plan views of a pad portion similar to FIG. 4M. FIG. 5A shows polish-stoppers 8 formed in stripes. FIG. 5B shows polish-stoppers 8 having a polygonal cross-section. FIG. 6C shows polish-stoppers 8 having a triangular cross-section. FIG. 6D shows polish stoppers 8 having a circular or an ellipsoidal cross-section. FIG. 6E shows polish-stoppers 8 having cross-sections of arbitrary various shapes. In any of the devices of FIGS. 5A to 6E, the shortest distance from any point in the Al electrode 12 to polish-stopper 8 or the side wall of Al electrode 12 is preferably not larger than 50 µm. This Example is characterized by the arbitrary sectional shape of polish-stopper 8, whereby dishing of the Al electrode caused in CMP polishing is reduced, and the scraping of the Al electrode in the pad portion is prevented to improve the yield of the CMP process.

EXAMPLE 2

Figure 7:
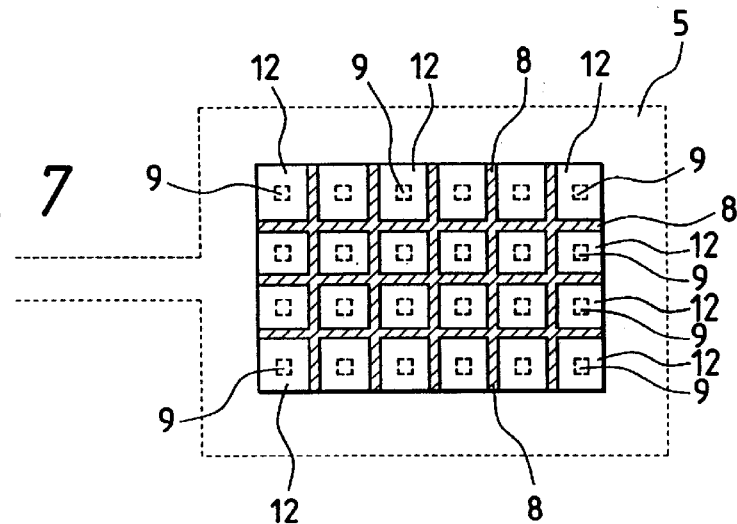
FIG. 7 illustrates schematically a still further example of the process for producing a semiconductor device of the present invention.

This Example is explained by reference to FIG. 7. FIG. 7 is a plan view of a pad portion similar to FIG. 4M. In FIG. 7, numeral 5 denotes a first Al wiring as lower layer; numeral 12 a second Al electrode as the upper layer; numeral 8 a polish-stopper; and the numeral 9 through holes connecting electrically the first Al wiring 5 to the second Al electrode 12. This Example is characterized by the grid-shaped polish-stoppers, partitioning of the second Al electrode 12 into segments in one pad portion, and electrical connection between the segments of the second Al electrode 12 and the first Al wiring 5 by through holes 9. Thereby, dishing of the second Al electrode 12 is reduced to prevent scraping of the Al electrode and to improve the yield in CMP process. The segments of the second Al electrode may be formed in an arbitrary form. The shortest distance from any point in the segments of Al electrode 12 to polish-stopper 8 is preferably not larger than 100 μm.

EXAMPLE 3

Figure 8A:
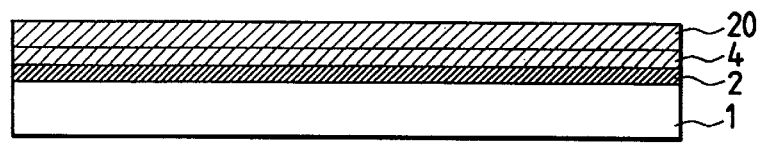
FIGS. 8A to 8E illustrate schematically a still further example of the process for producing a semiconductor device of the present invention.
Figure 8B:
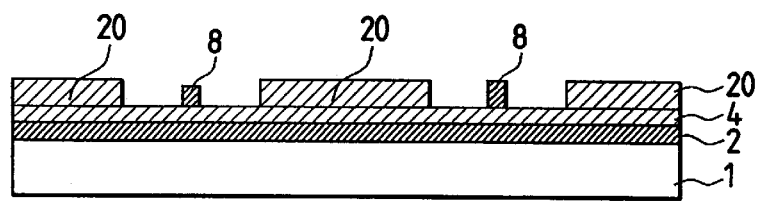
Figure 8C:
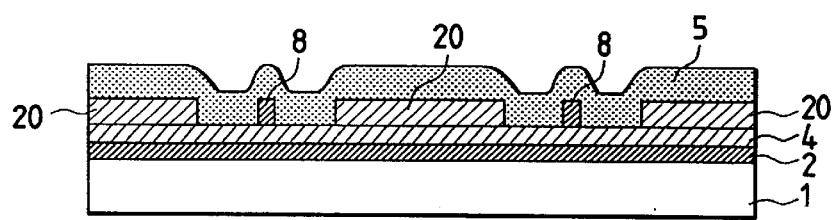
Figure 8D:
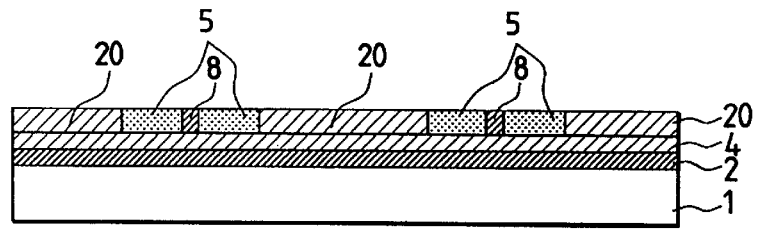
Figure 8E:
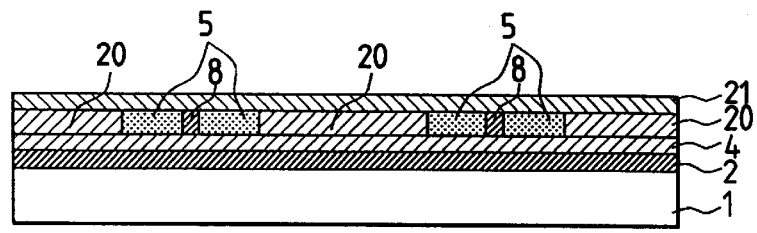
Figure 9F:
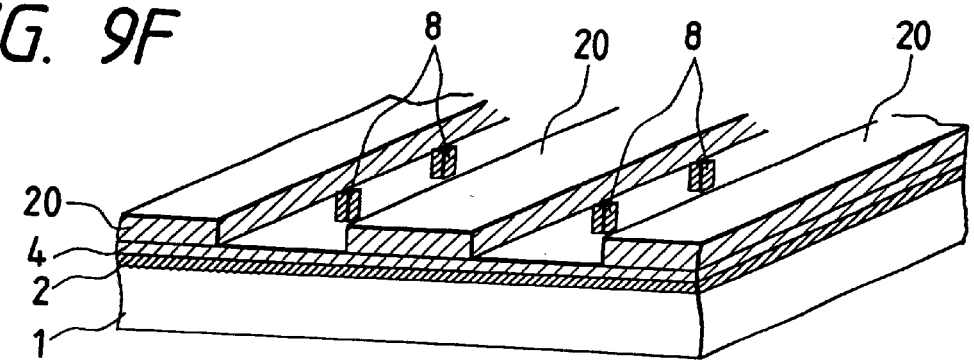
FIGS. 9F and 9G illustrate schematically a still further example of the process for producing a semiconductor device of the present invention.
Figure 9G:
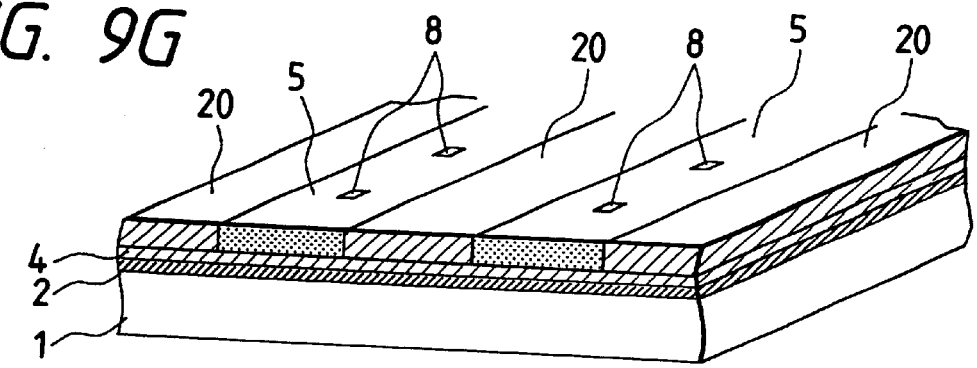

This Example is explained by reference to FIGS. 8A to 9G. In FIGS. 8A to 9G, numeral 1 denotes a semiconductor substrate; numeral 2, a thermal oxidation film formed by thermal oxidation of substrate 1; numeral 4, BPSG (Boro-Phospho-Silicate Glass); and numeral 20, p-SiO. The p-SiO 20 is subjected to patterning to form polishing-stopper 8 (FIG. 8B). In the patterning, the depth of the pattern is controlled by time of dry etching or wet etching. Thereon, an Al film 5 is formed by sputtering or the like method (FIG. 8C) in a film thickness larger than the depth of the pattern of FIG. 8B. Al wiring lines 5 are formed by CMP polishing (FIG. 8D). The CMP polishing and the cleaning are conducted under the same conditions as in the above Examples. Thereon, a p-SiN film 21 is formed (FIG. 8E). Thereafter, a second Al film, a third Al film, and so forth can be formed in the same manner as above for multilayer wiring. FIG. 9F is a perspective view of the state of FIG. 8B, and FIG. 9G is a perspective view of the state of FIG. 8D. FIGS. 8A to 8D show formation of Al wiring 5 by Damascene Process. This Example is characterized by polish-stoppers 8 provided in an island state within Al wiring 5. Polish-stopper portions 8 are formed in a shape of plural islands as shown in FIGS. 9F to 9G without partitioning of Al wiring 5. The shape of the cross-section is not limited. The polish-stoppers are preferably arranged such that the shortest distance from any point in Al wiring 5 to the polish-stopper 8 or the side wall of Al electrode 5 is not larger than 10 μm. By the above production process, the dishing of Al wiring 5 caused by the CMP polishing is limited to be not more than 200 Å. Thereby, increase or variation of wiring resistance is prevented to stabilize the device and to improve yield of the device.

EXAMPLE 4

Figure 10A:
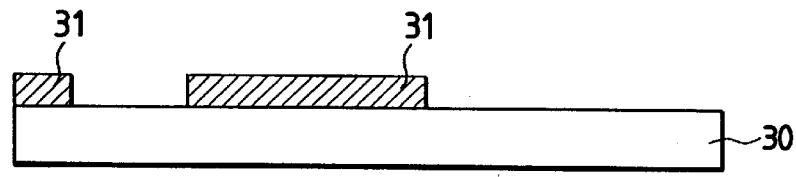
FIGS. 10A to 10E illustrate schematically an example of the process for producing an active matrix substrate of the present invention.
Figure 10B:
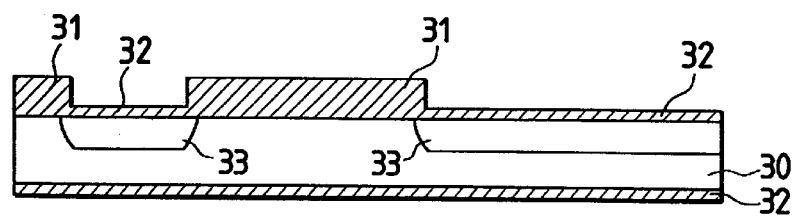
Figure 10C:
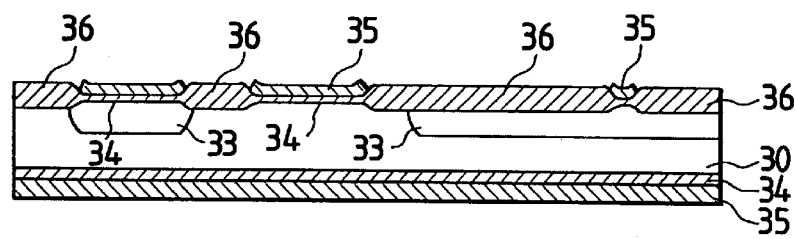
Figure 10D:
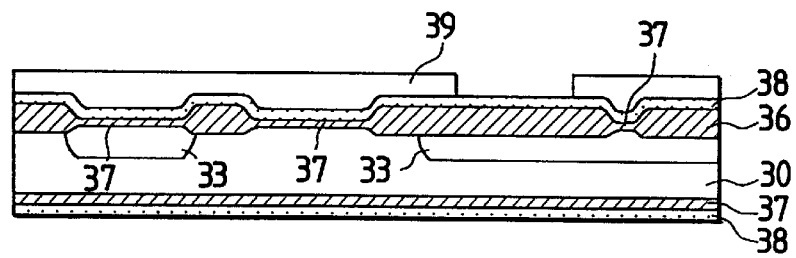

This Example is explained by reference to FIGS. 10A to 13K. In FIG. 10A, an N type silicon substrate 30 of 2.0 to 3.0 Ω·cm is thermally oxidized to form a thermal oxidation film of 7000 Å thick. The thermal oxidation film is subjected to wet etching with BHF to form a p-well pattern. Prior to implantation of p-well, the N type silicon substrate is thermally oxidized to form a p-well buffer oxidation film of 500 Å thick. Then boron is ion-implanted at a dose of $9 \times 10^{12}$ cm$^{-2}$ and an accelerating voltage of 60 KeV. Thermal oxidation films 31, 32 are removed by etching with BHF, and annealing is conducted at 1150° C. for 840 minutes to form p-wells 33 (FIG. 10B). Si substrate 30 was thermally oxidized to form a thermal oxidation film 34 of 350 Å thick, and subsequently an SiN film 35 is formed by low pressure CVD. SiN film 35 is patterned by dry etching, and a field oxidation films 36 are formed by thermal oxidation of Si substrate 30 in a thickness of 8000 Å (FIG. 10C). SiN film 35 is removed by wet etching with hot phosphoric acid, and a buffer thermal oxidation film is formed. Then a poly-Si film 38 is formed in a thickness of 700 Å. Resist 39 is patterned, and BF$_2$ is implanted at a dose of $1 \times 10^{12}$ cm$^{-2}$ and an accelerating voltage of 35 KeV to the portion of poly-Si 38 on which TFT (Thin Film Transistor) is to be formed later. After removal of the resist, annealing is conducted at 1100° C. for 60 minutes (FIG. 10D). After patterning of poly-Si 38, buffer oxidation film 37 is removed by etching with BHF to form a gate oxidation film in a thickness of 850 Å.

Figure 10E:
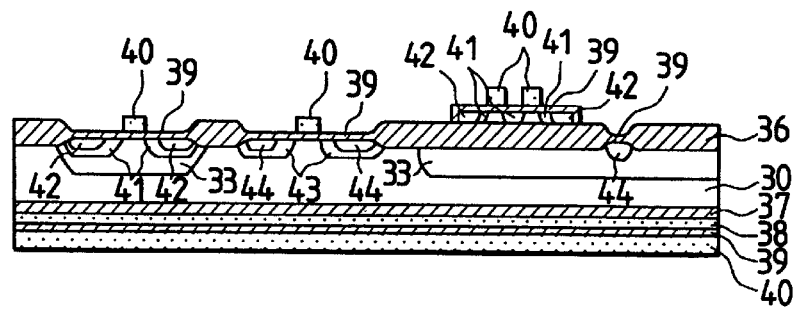
Figure 11F:
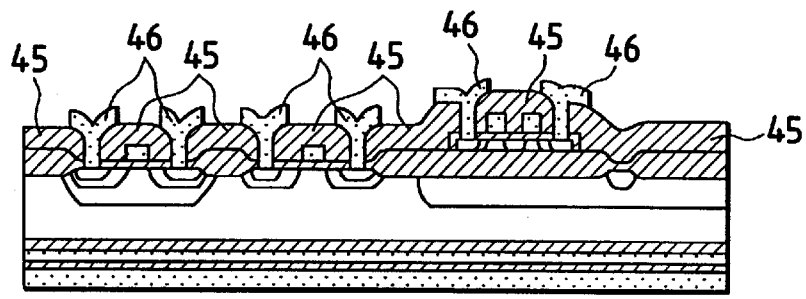
FIGS. 11F to 11H illustrate schematically another example of the process for producing an active matrix substrate of the present invention.
Figure 11G:
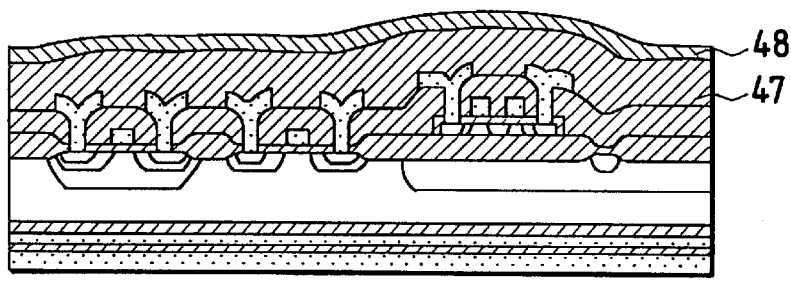
Figure 11H:
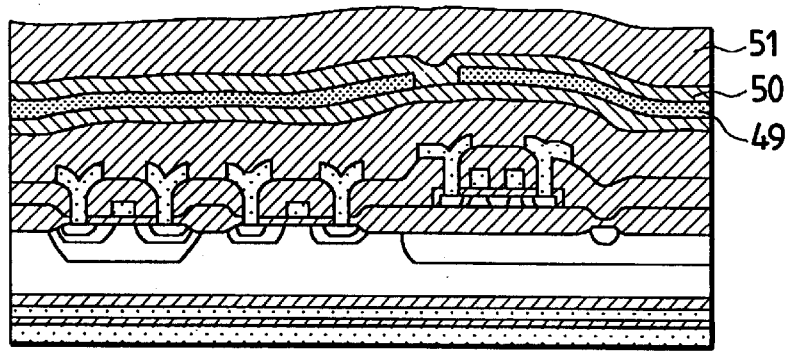
Figure 12I:
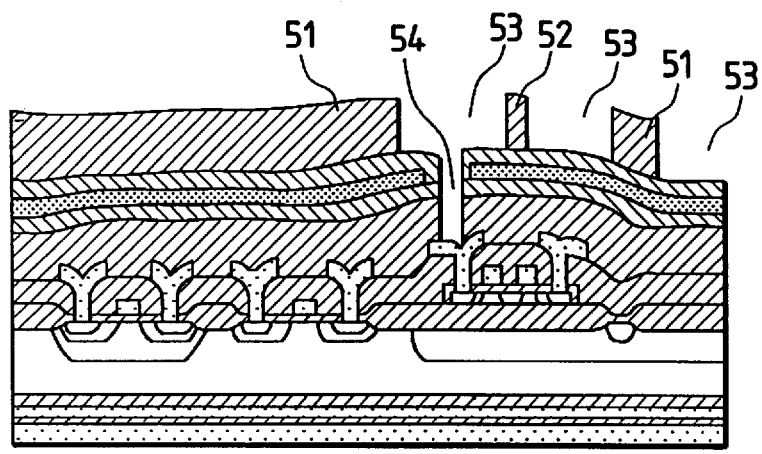
FIGS. 12I and 12J illustrate schematically still another example of the process for producing an active matrix substrate of the present invention.
Figure 12J:
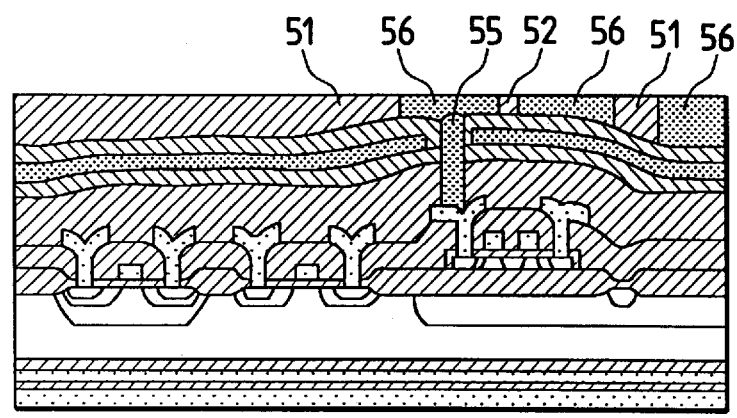
Figure 13K:
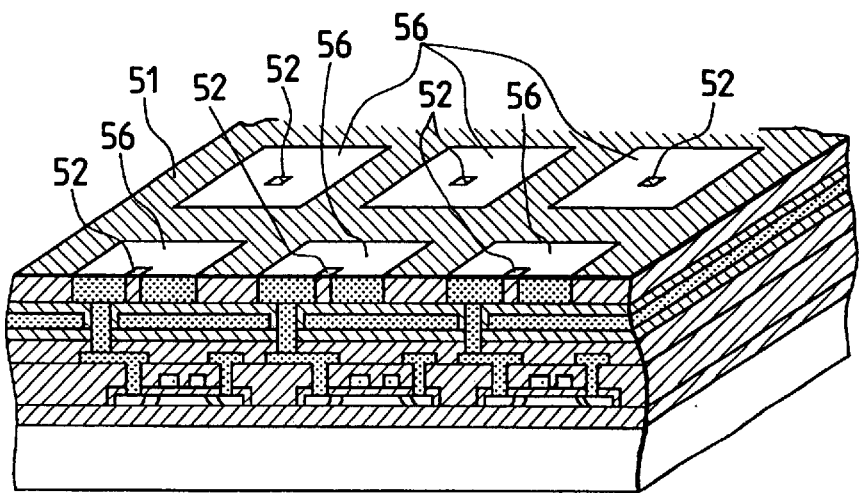
FIG. 13K illustrates schematically a further example of the process for producing an active matrix substrate of the present invention.
Figure 14A:
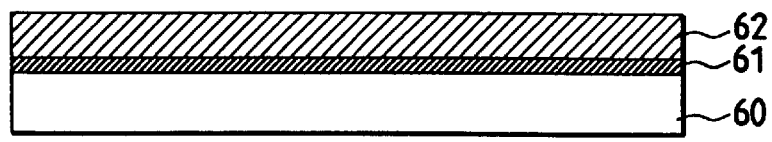
FIGS. 14A to 14D illustrate schematically an example of conventional processes for producing a semiconductor device.
Figure 14B:
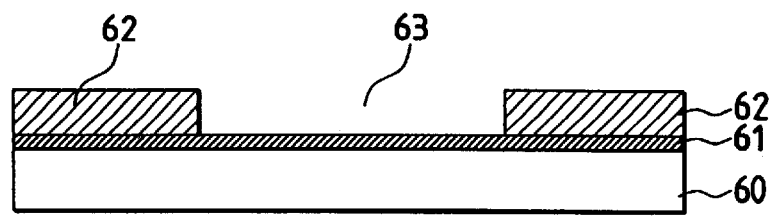
Figure 14C:
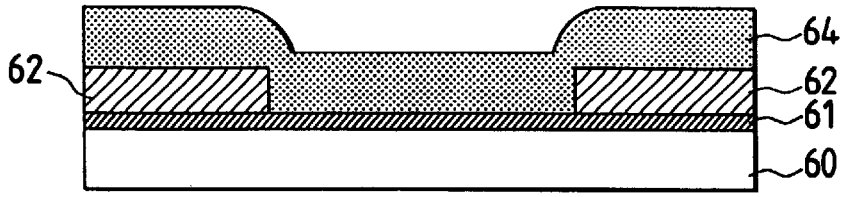
Figure 14D:
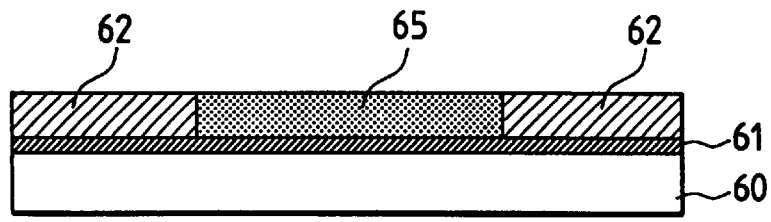
Figure 15E:
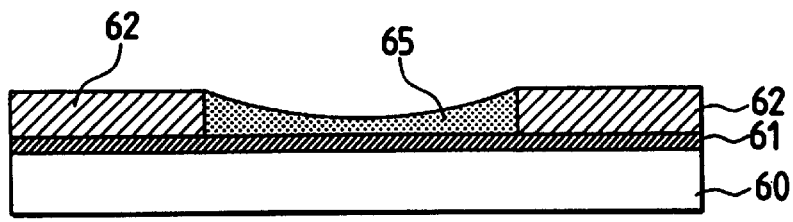
FIGS. 15E and 15F illustrate schematically another example of conventional processes for producing a semiconductor device.
Figure 15F:
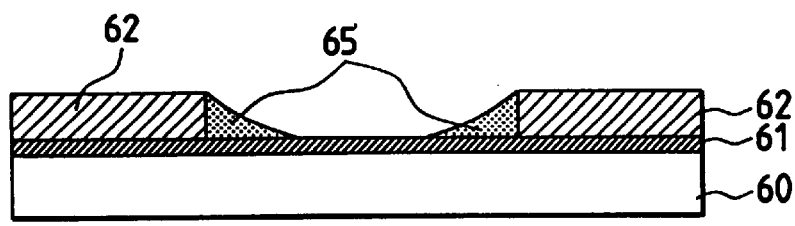
Figure 16:
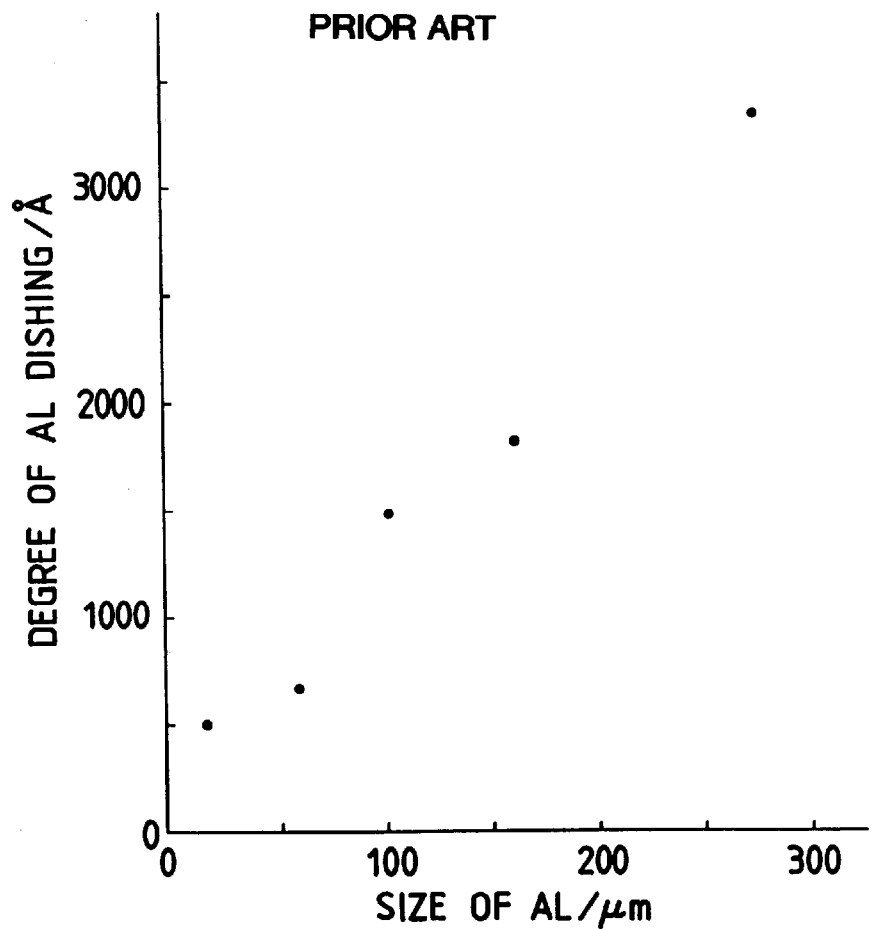
FIG. 16 is a graph showing dependence of the degree of dishing on the size of aluminum wiring in a conventional semiconductor device.

After formation of gate electrodes 40 from poly N Type Lightly doped Drain ("NLD") 41, N Type Source Drain ("NSD") 42, P Type Lightly doped Drain ("PLD") 43, and P Type Source Drain ("PSD") 44 are formed by ion injection. In formation of the respective diffusion layer, the dose/accelerating voltage is respectively $1 \times 10^{13}$ cm$^{-2}$ P/95 KeV for NLD 41; $5 \times 10^{15}$ cm$^{-2}$ P/95 KeV for NSD 42; $1.5 \times 10^{12}$ cm$^{-2}$ B/40 KeV for PLD 43; and $3 \times 10^{15}$ cm$^{-2}$ B/100 KeV for PSD 44. After completion of the ion injection, the diffusion layers are activated by annealing at 950° C. for 60 minutes (FIG. 10E). A BPSG layer 45 is formed in a thickness of 7000 Å. Contact holes are formed through the BPSG 45 by patterning. An Al film 46 is formed, and is patterned to form Al wiring 46 (FIG. 11F). Al wiring 46 is constituted of Ti of 1000 Å thick, TiN of 2000 Å thick, AlSi of 4000 Å thick, and TiN of 1000 Å thick, and the sheet resistance of Al wiring 46 is not higher than 0.1 Ω/square. An insulating interlayer film 47 is formed in a thickness of 10000 Å, and P-SiN film 48 is formed in a thickness of 2700 Å (FIG. 11G). Insulating interlayer film 47 is constituted of P-SiO of 4000 Å thick, SOG of 2000 Å thick, and P-SiO of 4000 Å thick. As the SOG, T-10 (trade name, Tokyo Ohka Kogyo K.K.) is used to mitigate the level difference. Ti film 49 is formed in a thickness of 3000 Å, and is patterned, and thereon a P-SiN film 50 is formed in a thickness of 3000 Å, and P-SiO film 51 is formed in a thickness of 1000 A (FIG. 11H). P-SiO film 51 is patterned, and CMP polish-stopper 52 and Al-remaining portion 53 are formed by Damascene Process. Then a through hole 54 is formed by patterning (FIG. 12I). Tungsten plug 55 is formed by filling the through hole 54 selectively by CVD. Al film is formed by sputtering in a thickness of 10000 Å or more, and is polished to form Al electrode 56 (FIG. 12J). The CMP polishing and the cleaning are conducted in the same manner as in the above Examples. The tungsten as the plug material may be replaced by another metal such as aluminum. FIG. 13K is a perspective view of the portion of Al 56 of FIG. 12J. This portion corresponds to an image display portion of a reflection type liquid crystal display. This example is characterized by the CMP polish-stopper 52 provided through Al 56 which is a reflection electrode of a reflection type liquid crystal display. Thereby, the dishing of Al electrode 56 is reduced, and the light introduced to Al electrode 56, the reflection electrode, is reflected in the same direction to result in improved brightness and improved contrast of a reflection type liquid crystal display. The picture element electrode substrate shown in FIG. 13K is a so-called active matrix substrate, in which signal lines are connected to the source, scanning lines are connected to the gate of the transistor, and reflection electrodes as the image picture electrodes are connected to the drain of the transistor. Polish-stoppers 52 are provided in the reflection electrodes.

The active matrix substrate shown in FIG. 13K is the one which has picture element electrodes made of metal provided on intersecting points of plural signal lines and plural scanning lines, and a means for applying voltage to the picture elements, wherein regions of another material different from the electrode material are placed within the region of the picture element electrode, and the thickness of the picture element electrode decreases from the periphery of the element electrode and then increases toward the region of the different material. The cross-sectional shape of polish-stopper 52 is selected arbitrarily without any limitation as shown in the above Examples. The polish-stopper 52 may be provided in plurality in one Al electrode 56. The polish-stoppers are preferably arranged such that the shortest distance from any point in Al electrode 56 to polish-stopper 52 or the side wall of Al electrode 56 is not larger than 10 μm. Thereby, the degree of dishing is reduced to 100 Å or less.

In this Example, a switching transistor for an image switching transistor is prepared by use of TFT. The present invention is also applicable to a transistor constituted by forming a diffusion layer on a silicon substrate 30. In this Example, the invention is described regarding a display apparatus employing a liquid crystal material. However, the present invention is not limited to thereto, and is applicable to electrodes or pads of the devices in which the angle of a mirror electrode (reflection electrode) is changed by changing the voltage.

What is claimed is:

1. A semiconductor device comprising:
   a first insulator, a metal film formed on the first insulator and a second insulator formed on the first insulator in the region of the metal film,
   wherein the surface of the metal film and the surface of the second insulator substantially form the same plane and the second insulator comprises a different material from that of the first insulator, and wherein said metal film provides dishing not more than 200 Å caused by CMP polishing, the shortest distance between a wall of said metal film and said second insulator is not more than 100 μm, and said second insulator is formed as an island in said metal film.

2. The semiconductor device according to claim 1, wherein the conductive film comprises aluminum and the second insulator comprises silicon oxide.

3. The semiconductor device according to claim 1, wherein the conductive film comprises aluminum, the second insulator comprises silicon oxide and the first insulator comprises silicon nitride.

4. The semiconductor device according to claim 1, wherein said second insulator defines an opening region retaining a portion of the second insulator within that opening region and said portion of said second insulator has a columnar shape.

5. A process for producing a semiconductor device according to claim 1, comprising:
   a first step of forming said first insulator on a semiconductor,
   a second step of forming said second insulator on the first insulator,
   a third step of forming an opening region in the second insulator retaining a portion of the second insulator within that opening region,
   a fourth step of forming said metal film on the second insulator, the opening region and the portion of the second insulator within said opening region, and
   a fifth step of polishing the metal film and the second insulator, thereby forming the flat region of the conductive film on the semiconductor substrate.

6. The process according to claim 5, wherein the conductive film comprises aluminum and the second insulator comprises silicon oxide.

7. The process according to claim 5, wherein the conductive film comprises aluminum, the second insulator comprises silicon oxide and the first insulator comprises silicon nitride.

8. The process according to claim 5, wherein the step of polishing comprises using chemical mechanical polishing.

9. The process according to claim 5, wherein the semiconductor comprises polysilicon.

10. The process according to claim 5, wherein said portion of the second insulator within said opening region has a columnar shape.

11. An active matrix substrate having a metal picture element electrode provided corresponding to intersecting points of plural signal lines and plural scanning lines, and means for applying voltage to the picture elements, comprising:
    a first insulator, a metal film which acts as picture elements formed on the first insulator and a second insulator formed on the first insulator in the region of the metal film,
    wherein the surface of the metal film and the surface of the second insulator substantially form the same plane and the second insulator comprises a different material from that of the first insulator, and wherein said metal film provides dishing not more than 200 Å caused by CMP polishing, the shortest distance between a wall of said metal film and said second insulator is not more than 100 μm and said second insulator is formed as an isolated moiety in said metal film.

12. The active matrix substrate according to claim 11, wherein the metal film comprises aluminum and the second insulator comprises silicon oxide.

13. The active matrix substrate according to claim 11, wherein the metal film comprises aluminum, the second insulator comprises silicon oxide and the first insulator comprises silicon nitride.

14. The active matrix substrate according to claim 11, wherein said second insulator defines an opening region retaining a portion of the second insulator within that opening region and said portion of said second insulator has a columnar shape.

15. A process for producing an active matrix substrate according to claim 11, comprising:
    a first step of forming said first insulator on a semiconductor,
    a second step of forming said second insulator on the first insulator,
    a third step of forming an opening region in the second insulator retaining a portion of the second insulator within that opening region,
    a fourth step of forming said metal film on the first insulator, the opening region and the portion of the second insulator within said opening region, and
    a fifth step of polishing the conductive film and the second insulator, thereby forming the flat region of the conductive film on the semiconductor substrate.

16. The process according to claim 15, wherein the metal film comprises aluminum and the second insulator comprises silicon oxide.

17. The process according to claim 15, wherein the conductive film comprises aluminum, the second insulator comprises silicon oxide and the first insulator comprises silicon nitride.

18. The process according to claim 15, wherein the step of polishing comprises chemical mechanical polishing.

19. The process according to claim 15, wherein the semiconductor comprises polysilicon.

20. The process according to claim 15, wherein said portion of the second insulator within said opening region has a columnar shape.

* * * * *

UNITED STATES PATENT AND TRADEMARK OFFICE
CERTIFICATE OF CORRECTION

PATENT NO.     : 6,307,264 B1
DATED           : October 23, 2001
INVENTOR(S)  : Yoshihiko Fukumoto It is certified that error appears in the above-identified patent and that said Letters Patent is hereby corrected as shown below:

Title page,
Item [57], ABSTRACT,
Line 2, "of" (second occurrence) should be deleted; and
Line 11, "of" (first occurrence) should be deleted.

Column 1,
Line 31, "of" should read -- thereof --.

Column 2,
Line 28, "and" should read -- and a --; and
Line 43, "and" should read -- with --.

Column 4,
Line 11, "results" should read -- result --; and
Line 13, "the" should read -- as the --.

Column 6,
Line 5, "to" should read -- is applied to --; and
Line 12, "poly" should read -- poly Si, --; and
Line 24, "BPSG45" should read -- BPSG layer 45 --.

Column 7,
Line 18, "to" should be deleted;
Line 30, "wherein" should read -- ¶wherein --; and
Line 57, "semiconductor," should read -- semiconductor substrate, --.

UNITED STATES PATENT AND TRADEMARK OFFICE
CERTIFICATE OF CORRECTION

PATENT NO. : 6,307,264 B1
DATED : October 23, 2001
INVENTOR(S) : Yoshihiko Fukumoto It is certified that error appears in the above-identified patent and that said Letters Patent is hereby corrected as shown below:

<u>Column 8,</u>
Line 4, "conductor" should read -- conductor substrate --; and
Line 20, "wherein" should read -- ¶wherein --; and
Line 41, "semiconductor" should read -- semiconductor substrate --; and
Line 61, "comprises" should read -- comprises using --;
Line 63, "semiconductor" should read -- semiconductor substrate --.

Signed and Sealed this

Seventeenth Day of December, 2002

JAMES E. ROGAN
*Director of the United States Patent and Trademark Office*